United States Patent
Seto et al.

(10) Patent No.: US 8,854,693 B2
(45) Date of Patent: Oct. 7, 2014

(54) IMAGE EDITING APPARATUS, IMAGE EDITING METHOD, AND RECORDING MEDIUM

(71) Applicant: FUJIFILM Corporation, Tokyo (JP)

(72) Inventors: Satoshi Seto, Tokyo (JP); Kakuya Ide, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/853,114

(22) Filed: Mar. 29, 2013

(65) Prior Publication Data

US 2013/0258415 A1 Oct. 3, 2013

(30) Foreign Application Priority Data

Mar. 30, 2012 (JP) ................................. 2012-082107

(51) Int. Cl.
| | |
|---|---|
| *B41C 1/04* | (2006.01) |
| *H04N 1/46* | (2006.01) |
| *G06F 3/12* | (2006.01) |
| *G03F 9/00* | (2006.01) |
| *H04N 1/387* | (2006.01) |

(52) U.S. Cl.
CPC ................ *G03F 9/00* (2013.01); *G06F 3/1263* (2013.01); *G06F 3/1262* (2013.01); *H04N 1/3873* (2013.01)
USPC .......................................... 358/3.29; 358/537

(58) Field of Classification Search
USPC ............ 358/3.29, 537, 502; 348/88; 101/170, 101/365, 350.1
See application file for complete search history.

(56) References Cited

U.S. PATENT DOCUMENTS

| | | | | |
|---|---|---|---|---|
| 4,649,500 | A | * | 3/1987 | Yamada et al. ................ 101/170 |
| 5,031,534 | A | * | 7/1991 | Brunner ........................ 101/365 |
| 2007/0013940 | A1 | | 1/2007 | Field |
| 2009/0033978 | A1 | | 2/2009 | Morales |

FOREIGN PATENT DOCUMENTS

| | | |
|---|---|---|
| EP | 1 975 774 A2 | 10/2008 |
| JP | 2000-326473 A | 11/2000 |
| JP | 2002-361999 A | 12/2002 |

(Continued)

OTHER PUBLICATIONS

Decision to Grant a Patent, mailed Nov. 19, 2013, issued in corresponding Japanese Patent Application No. 2012-082107.

(Continued)

*Primary Examiner* — Charlotte M Baker
(74) *Attorney, Agent, or Firm* — Birch, Stewart, Kolasch & Birch, LLP

(57) ABSTRACT

An image editing apparatus configured to perform ganging of a plurality of content images on a printing plate capable of transferring ink onto an output medium, includes: a region dividing unit that two-dimensionally divides a predetermined region on the printing plate into a plurality of sub regions; a priority order giving unit that gives an order of priority of disposition to each of the sub regions in a descending order of relative transfer amounts of the ink onto the output medium; a usage amount estimating unit that estimates respective usage amounts of the ink according to two or more content images out of the plurality of content images; and a disposition determining unit that determines respective disposing positions of the content images according to a disposition rule for sequentially disposing the content images of which the usage amount is estimated to be large in the sub regions having high priorities.

18 Claims, 14 Drawing Sheets

(56) References Cited

FOREIGN PATENT DOCUMENTS

| JP | 2004-058433 A | 2/2004 |
|----|---------------|--------|
| JP | 2007-134935 A | 5/2007 |
| JP | 2011-3092 A   | 1/2011 |

OTHER PUBLICATIONS

Extended European Search Report, dated Jun. 10, 2014, for European Application No. 13161188.1.

\* cited by examiner

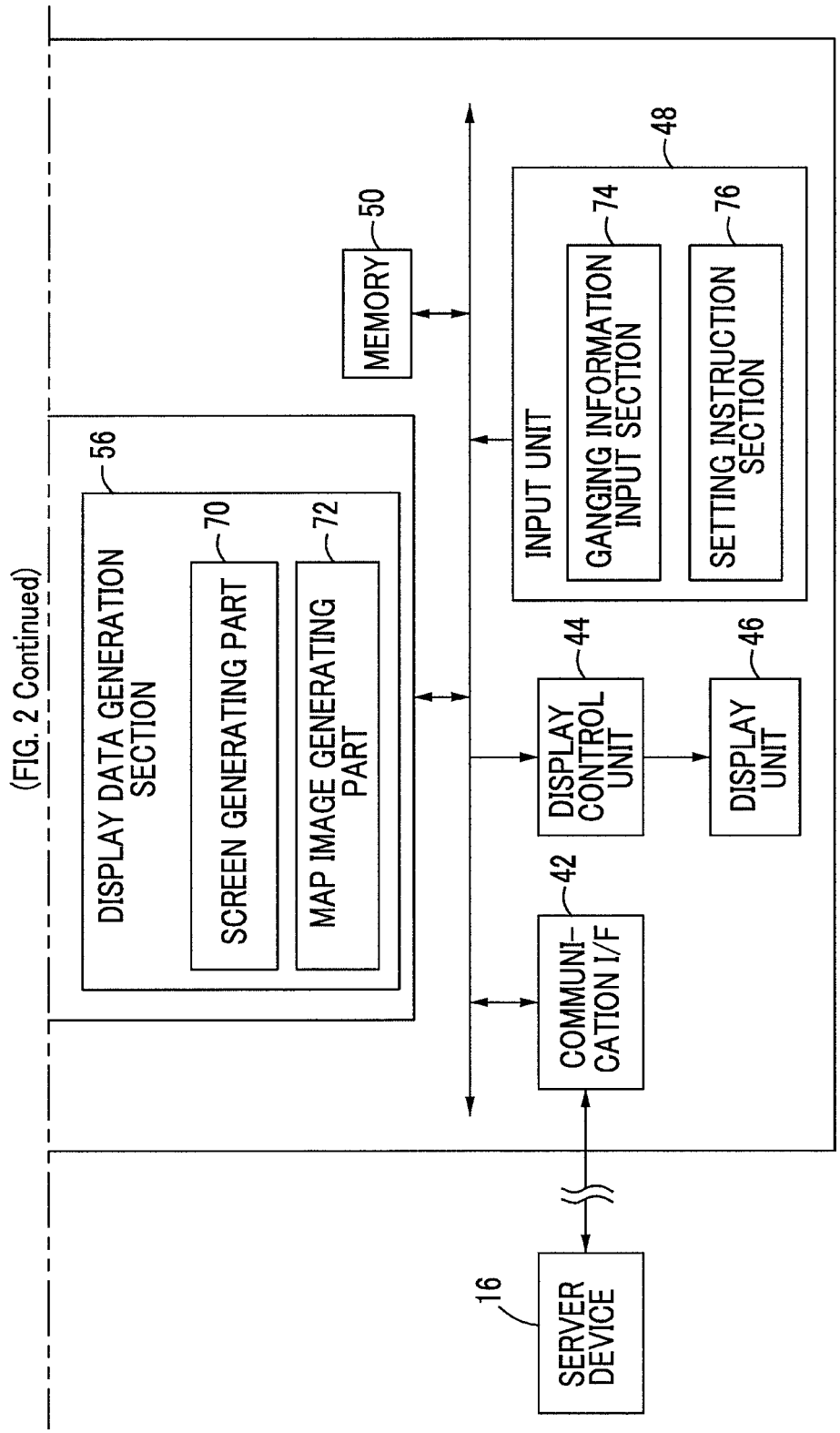
(FIG. 2 Continued)

(FIG. 4 Continued)

| | | | | | | | | |
|---|---|---|---|---|---|---|---|---|
| 110814-0241 | RESTAURANT MUSASI | 2/27 | 4/4 | 1000 | REPRODUC-TION COAT⟨90⟩ | ↕ | A3 | A4 FOLDED PAMPHLET |
| 100924-0449 | FGS | 2/28 | 4/0 | 500 | HIGH QUALITY⟨180⟩ | ↕ | BUSINESS CARD | BUSINESS CARD |
| 111007-0578 | Wing Coffee | 2/26 | 4/0 | 4000 | HIGH QUALITY⟨90⟩ | | A5 | FLYER |
| 111007-0687 | SETO COMPANY | 2/24 | 4/4 | 3000 | COAT⟨73⟩ | ↕ | A3 | A4 FOLDED PAMPHLET |
| 080622-0154 | Wing Coffee | 2/26 | 4/4 | 2000 | REPRODUC-TION COAT⟨90⟩ | ↕ | A4 | THREE-FOLDED PAMPHLET |
| 111007-0578 | Wing Coffee | 2/26 | 4/2 | 1000 | HIGH QUALITY⟨90⟩ | | A5 | FLYER |
| 080622-0874 | Wing Coffee | 2/26 | 4/4 | 2000 | REPRODUC-TION COAT⟨90⟩ | | 140X140 | FLYER |
| 101230-0517 | SIMPLE REALTY | 2/25 | 4/1 | 3000 | COAT⟨90⟩ | | A4 | FLYER |
| 86a | 86b | 86c | 86d | 86e | 86f | 86g | 86h | 86i |

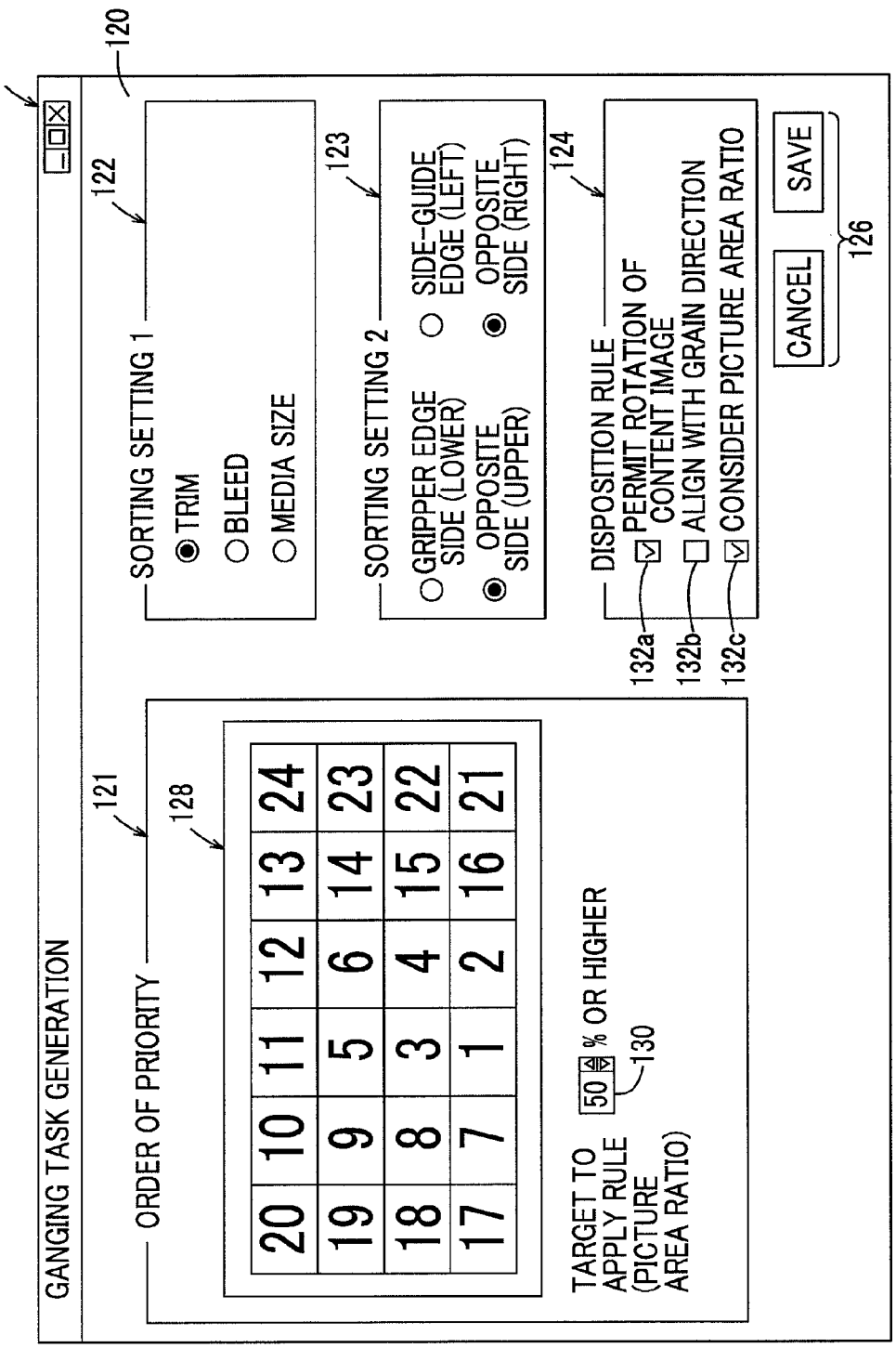

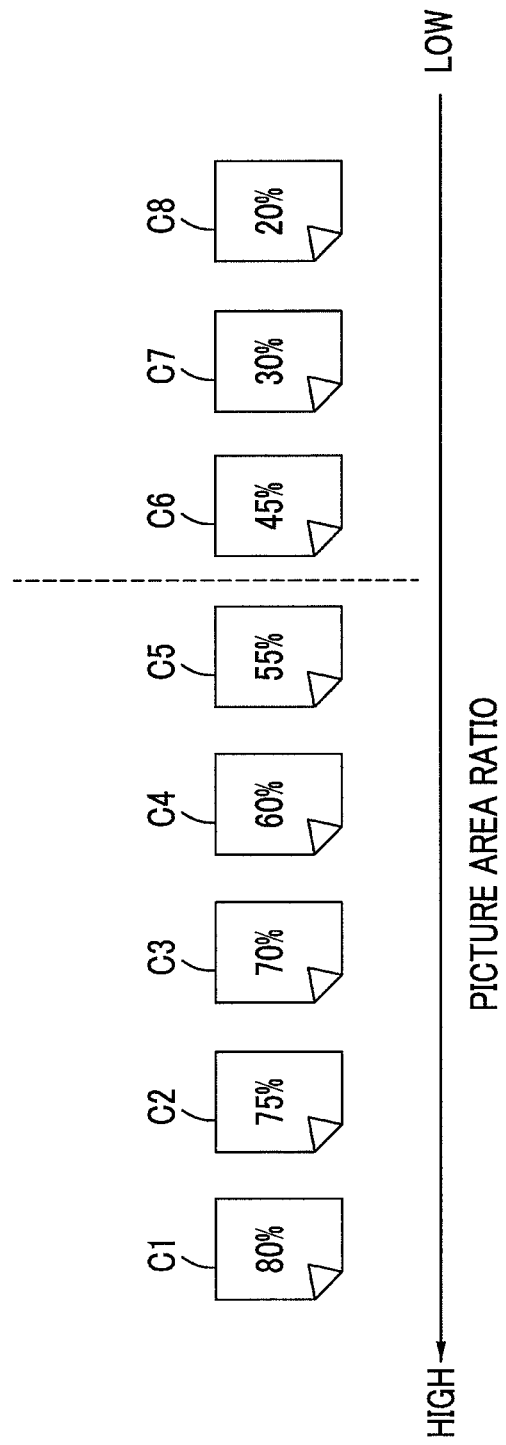

IMAGE EDITING APPARATUS, IMAGE EDITING METHOD, AND RECORDING MEDIUM

BACKGROUND OF THE INVENTION

1. Field of the Invention

The present invention relates to an image editing apparatus, an image editing method, and a computer-readable recording medium, which enable ganging of a plurality of content images on a printing plate capable of transferring ink onto an output medium.

2. Description of the Related Art

In the related art, a variety of technologies for stably reproducing colors of a printed matter has been proposed in the field of printing. JP2004-058433A and JP2007-134935A, for example, propose printing apparatuses and printing methods for controlling opening of ink keys based on picture information on each surface of printing papers.

SUMMARY OF THE INVENTION

The present inventors have found through examination and research that the tendencies of two-dimensional distribution of an ink amount transferred onto a sheet as an output medium vary according to types of printing plates provided for printing (for example, off-set printing).

The apparatuses and methods proposed in JP2004-058433A and JP2007-134935A, however, achieved no outcome with regard to unevenness in colors found along a conveying direction of a sheet, merely being capable of adjusting an ink amount along a width direction (a direction orthogonal to the conveying direction) of the sheet. Particularly, in a case of "ganging", in which two or more content images are assigned and disposed on a printing plate, the influence of the unevenness is apparent.

The present invention has been made to solve the above-described problems, and the object thereof is to provide an image editing apparatus, an image editing method, and a computer-readable recording medium, which enable stable reproduction of colors on a printed matter using a simple technique that does not require complicated adjustment of a printer even when unevenness of a transfer amount of ink is two-dimensionally present.

According to an aspect of the present invention, there is provided an image editing apparatus configured to perform ganging of a plurality of content images on a printing plate capable of transferring ink onto an output medium. The image editing apparatus includes: a region dividing unit that two-dimensionally divides a predetermined region on the printing plate into a plurality of sub regions; a priority order giving unit that gives an order of priority of disposition to each of the sub regions divided by the region dividing unit in a descending order of relative transfer amounts of the ink onto the output medium; a usage amount estimating unit that estimates respective usage amounts of the ink according to two or more content images out of the plurality of content images; and a disposition determining unit that determines respective disposing positions of the content images according to a disposition rule for sequentially disposing the content images of which the usage amount is estimated to be large by the usage amount estimating unit in the sub regions having high priorities given by the priority order giving unit.

As described above, since the priority order giving unit that gives the order of priority of disposition to the plurality of sub regions which are two-dimensionally divided in order of relatively large ink transfer amounts onto the output medium, and the disposition determining unit that determines the respective disposing positions of the content images according to the disposition rule for sequentially disposing content images that is estimated to have a large usage amount in a sub region to which a high priority is given by the priority order giving unit, are provided, a content image that has a large ink usage amount can be disposed in a sub region having a high priority, and a content image that has a small ink usage amount can be disposed in a sub region having a low priority.

In general, higher color reproducibility is likely to be shown in regions that have relatively higher ink transfer amounts. By sequentially disposing content images (images having a large ink usage amount) that require high color reproducibility, the entire colors on the printed matter formed on the output medium can be stably reproduced. In other words, even when there is two-dimensional unevenness in ink transfer amounts, the colors of the printed matter can be stably reproduced using a simple technique that does not require complicated adjustment of a printer (considering the disposition of the content images).

In addition, the usage amount estimating unit may further estimate a distribution characteristic of the usage amount of each of the content images, and the disposition determining unit may further determine the orientation of each of the content images based on the distribution characteristic estimated by the usage amount estimating unit so that portions of the content images of which the usage amount is estimated to be large are disposed in the sub regions having high priorities.

Furthermore, the image editing apparatus may further include a map image generating unit that generates a map image, which is a simulated image of the printing plate, and which visualizes association between a position of each of the sub regions and the order of priority.

Furthermore, the priority order giving unit may give each of the sub regions the order of priority according to a characteristic of a printer.

Furthermore, the disposition determining unit may determine respective disposing positions of the content images of which the usage amount belongs to a predetermined range out of the plurality of content images according to the disposition rule. Accordingly, remaining content images to which the disposition rule is not applied may be freely disposed in remaining disposition-scheduled regions, and the degree of freedom for setting ganging increases, which is convenient for an operator.

Furthermore, the disposition determining unit may determine the respective disposing positions of the content images so as to align the content images with an end of a printable region on the printing plate on the opposite side of a gripper edge and/or a side-guide edge.

Furthermore, the disposition determining unit may further determine a disposing position of at least one dividing line, which divides adjacent content images.

According to another aspect of the invention, there is provided an image editing method for ganging a plurality of content images on a printing plate capable of transferring ink onto an output medium. The image editing method includes steps of: two-dimensionally dividing a predetermined region on the printing plate into a plurality of sub regions; giving an order of priority of disposition to each of the divided sub regions in a descending order of relative transfer amounts of the ink onto the output medium; estimating respective usage amounts of the ink according to two or more content images out of the plurality of content images; and determining respective disposing positions of the content images according to a disposition rule for sequentially disposing the content images of which the usage amount is estimated to be large in the sub regions having given high priorities.

According to still another aspect of the present invention, there is provided a non-transitory computer-readable recording medium having recorded thereon a program for ganging a plurality of content images on a printing plate capable of transferring ink onto an output medium. The program causes the image editing apparatus to function as: a region dividing unit that two-dimensionally divides a predetermined region on the printing plate into a plurality of sub regions; a priority order giving unit that gives an order of priority of disposition to each of the sub regions divided by the region dividing unit in a descending order of relative transfer amounts of the ink onto the output medium; a usage amount estimating unit that estimates respective usage amounts of the ink according to two or more content images out of the plurality of content images; and a disposition determining unit that determines respective disposing positions of the content images according to a disposition rule for sequentially disposing the content images of which the usage amount is estimated to be large by the usage amount estimating unit in the sub regions having high priorities given by the priority order giving unit.

According to the image editing apparatus, the image editing method, and the computer-readable recording medium of the present invention, since the order of priority of disposition is given to a plurality of sub regions that are two-dimensionally divided in a descending order of the relative transfer amounts of the ink onto the output medium, and the respective disposing positions of each of the content images are determined according to the disposition rule for sequentially disposing the content images of which the usage amount is estimated to be large in the sub regions having high priorities, a content image that has a large ink usage amount can be disposed in a sub region having a high priority, and a content image that has a small ink usage amount can be disposed in a sub region having a low priority.

In general, higher color reproducibility is likely to be found in regions that have relatively higher ink transfer amounts. By sequentially disposing content images (images having a large ink usage amount) that require high color reproducibility in such regions, the entire colors on the printed matter formed on the output medium can be stably reproduced. In other words, even when there is two-dimensional unevenness in ink transfer amounts, the colors of the printed matter can be stably reproduced using a simple technique that does not require complicated adjustment of a printer (considering the disposition of the content images).

BRIEF DESCRIPTION OF THE DRAWINGS

FIG. 6 is an image diagram showing an example of a second editing screen.

FIG. 7 is a schematic diagram showing results obtained by estimating usage amounts of ink according to each content image.

DESCRIPTION OF THE PREFERRED EMBODIMENT

Hereinafter, an image editing method according to the present invention will be described referring to accompanying drawings, by exemplifying a preferred embodiment in the relationship of an image editing apparatus, a program, and a printed matter production system, which implement the method.

Figure 1:
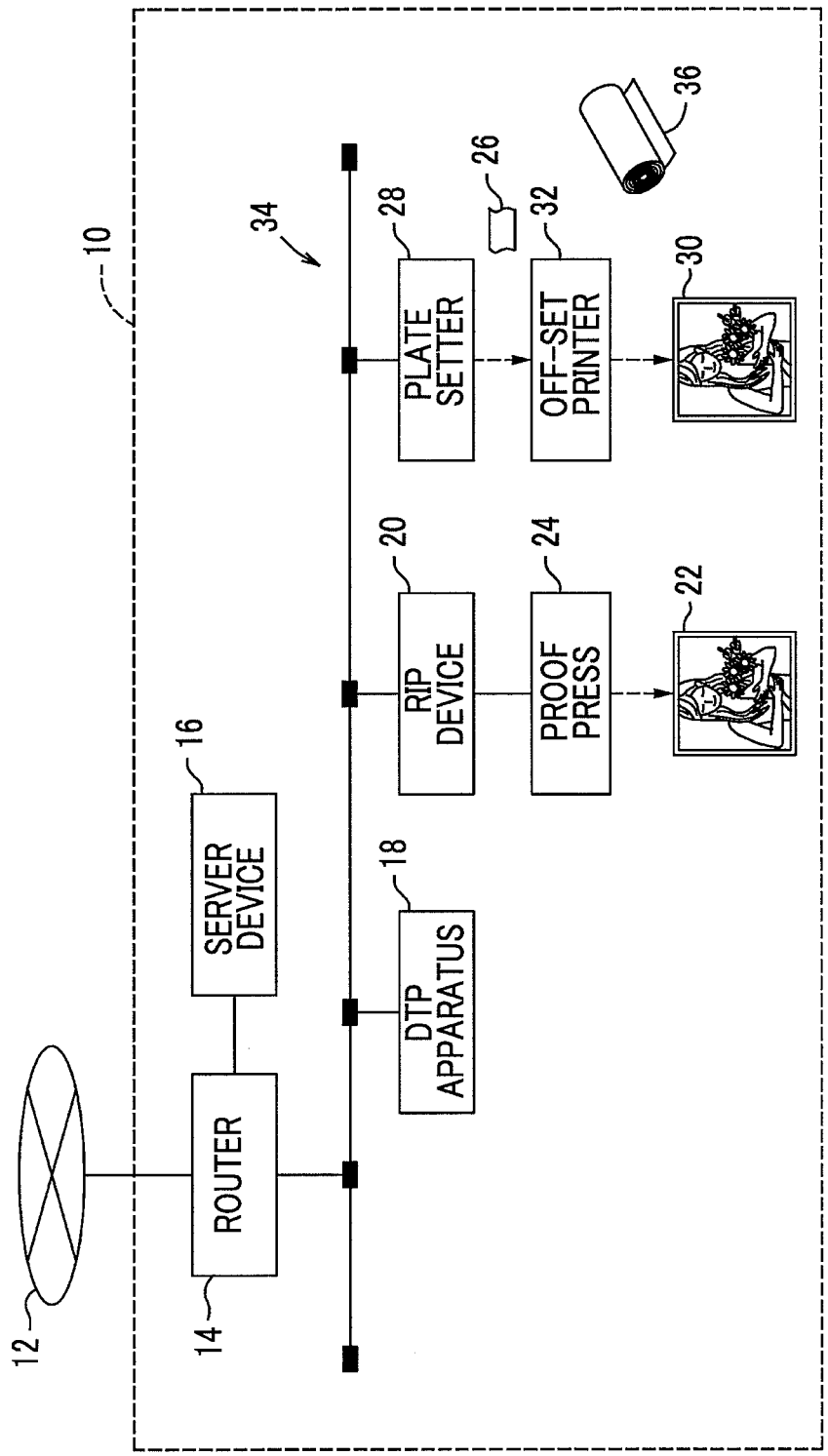
FIG. 1 is an outlined configuration diagram of a printed matter production system into which a DTP apparatus as an image editing apparatus according to an embodiment is incorporated.

FIG. 1 is an outlined configuration diagram of a printed matter production system 10 into which a DTP apparatus 18 as an image editing apparatus according to an embodiment is incorporated.

In the printed matter production system 10, a router 14, a server device 16, a DTP apparatus 18 (image editing apparatus), an RIP device 20, a proof press 24, a plate setter 28, and an off-set printer 32 are respectively provided. The router 14 is a device that relays connection to a network 12. The server device 16 is accessible via the network 12 from each terminal device that belongs to an external network and is not shown in the drawing. The DTP apparatus 18 performs a DTP (Desktop Publishing) process including editing of content data acquired from the server device 16, or the like. The RIP device 20 executes each image processing such as rasterizing, or color conversion based on correction data or plate-making data generated by the DTP apparatus 18. The proof press 24 is capable of printing a proof 22 based on processed correction data that is transmitted from the RIP device 20. The plate setter 28 produces a printing plate 26 based on plate-making data that is transmitted from the RIP device 20. The off-set printer 32 is installed with the printing plate 26 and thereby prints a printed matter 30.

The server device 16 is a device that constitutes the core of work flow management in the printed matter production system 10. The server device 16 is connected to each terminal device provided for designers and/or production companies (not shown) via the router 14 and the network 12 so as to be able to communicate with each other. In addition, the server device 16 is connected to the DTP apparatus 18, the RIP device 20, and the plate setter 28 via a LAN (Local Area Network) 34 that is built in the printed matter production system 10 so as to be able to communicate with each other.

In other words, the server device 16 is configured to respectively fulfill a function as a file server that takes in charge of storage and transfer of various data files, a function as an authority management server that manages task authority that can be exercised over print jobs, each terminal device, or each user, or a function as a mail server that generates and distributes notification mails at a predetermined timing such as start and end of each process. In addition, the various data files that can be managed as in the file server include, for example, content data, correction data, plate-making data, a job ticket (for example, a JDF (Job Definition Format) file), an ICC (International Color Consortium) profile, color sample data, various kinds of information pertaining to ganging (hereinbelow, referred to as ganging information), and the like.

The DTP apparatus 18 performs a preflight process on content data that includes characters, figures, pictures, photos, or the like, and then generates edited data in a unit of pages. In addition, the DTP apparatus 18 performs an imposition process (including ganging) according to instructed binding method and paper-folding method while referring to tag information of the job ticket.

The RIP device 20 functions as a print processing server for at least one printer. In the example of FIG. 1, the RIP device 20 is connected to the proof press 24 and the plate setter 28 so as to be able to communicate with each other. In this case, the RIP device 20 performs rasterizing on proofread data described in a page description language (including proofread data), and then supplies obtained print data to the proof press 24 (or the plate setter 28). In this rasterizing, a data format conversion process for converting from a PDL (Page Description Language) format to a raster format, and a color matching process using the ICC profile are included.

The proof press 24 prints the proof 22 based on the print data supplied from the RIP device 20. As the proof press 24, a DDCP (Direct Digital Color Proofing), an ink jet color proofer, a color laser printer with low resolution (of an electrophotographic type), an ink jet printer, or the like may be used.

The off-set printer 32 forms the printed matter 30 by transferring ink (color material) onto a sheet 36 (output medium) via the printing plate 26 and an intermediate transfer body not shown in the drawing. Instead of the off-set printer 32, a digital printer for direct printing may be provided. As a digital printer, an ink jet color proofer, a color laser printer (of an electrophotographic type), or the like may be used.

Figure 2:
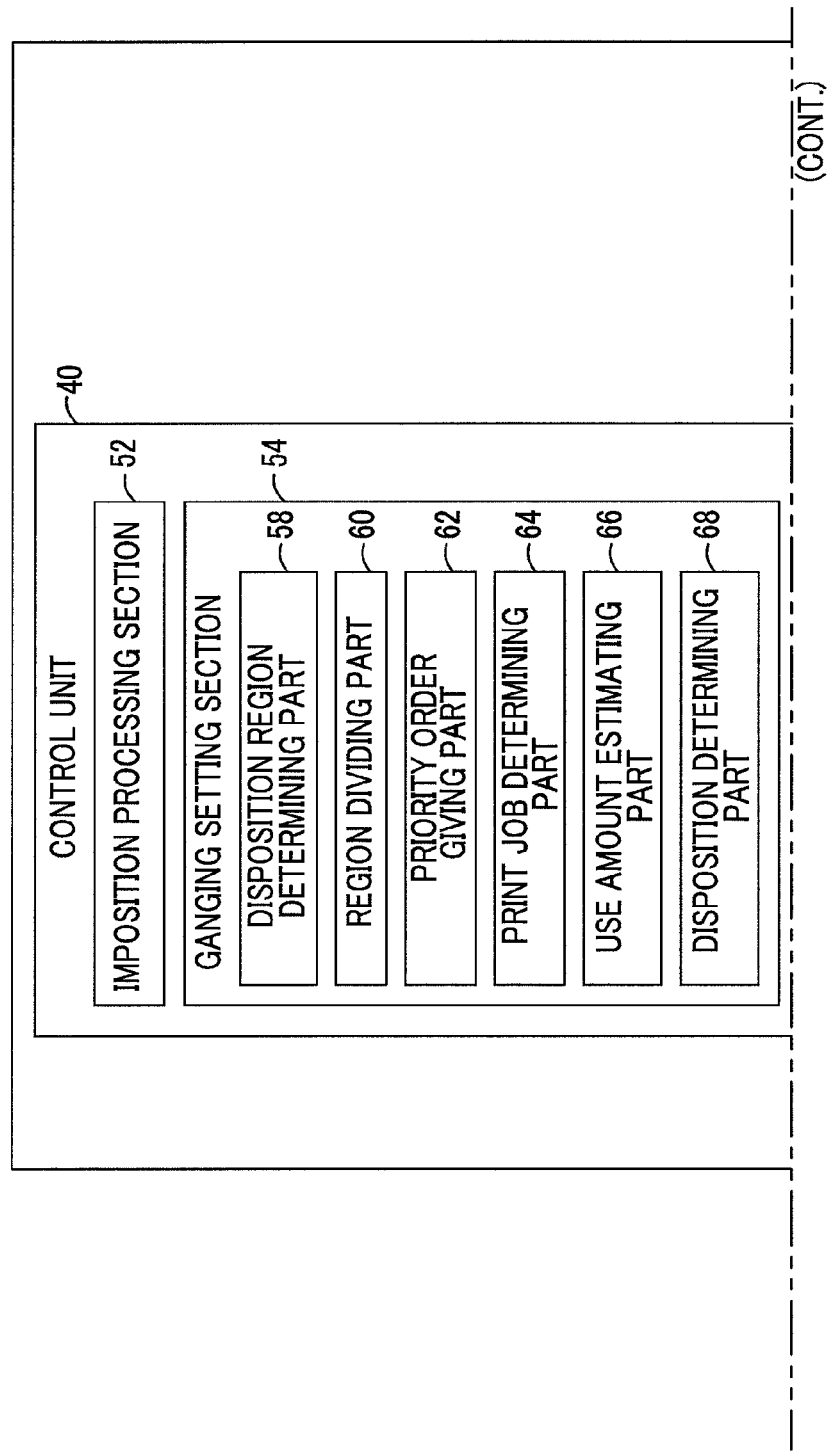
FIG. 2 is an electrical block diagram of the DTP apparatus shown in FIG. 1.

FIG. 2 is an electrical block diagram of the DTP apparatus 18 shown in FIG. 1.

The DTP apparatus 18 includes a control unit 40, a communication I/F 42, a display control unit 44, a display unit 46, an input unit 48, and a memory 50 (storage medium).

The communication I/F 42 is an interface that transmits and receives electrical signals from an external device. For example, the communication I/F is capable of acquiring various kinds of information such as correction data, plate-making data, the ICC profile, or ganging information managed and stored in the server device 16 (refer to FIG. 1).

The display control unit 44 is a control circuit that controls drive of the display unit 46 according to control of the control unit 40. By the display control unit 44 outputting display control signals to the display unit 46 via an I/F not shown in the drawing, the display unit 46 is driven. Accordingly, the display unit 46 is capable of displaying various kinds of images including windows W1 (refer to FIG. 4), W2 (refer to FIGS. 5), and W3 (refer to FIG. 6).

The memory 50 stores programs and data necessary for the control unit 40 to control each constituent element. The memory 50 may be a storage medium such as a non-volatile memory, or a hard disk.

The control unit 40 includes a processor such as a CPU (Central Processing Unit). The control unit 40 is capable of implementing each function of an imposition processing section 52, a ganging setting section 54, and a display data generation section 56 by reading and executing programs stored in the memory 50.

The imposition processing section 52 executes a preflight process on input material data, and then performs an imposition process according to instructed binding method and paper-folding method.

The ganging setting section 54 generates a task for setting ganging (hereinafter, referred to as a ganging task), and performs various kinds of setting with regard to ganging. Specifically, the ganging setting section 54 includes a disposition region determining part 58, a region dividing part 60, a priority order giving part 62, a print job determination part 64, a usage amount estimating part 66, and a disposition determining part 68. The disposition region determining part 58 determines respective disposition-scheduled regions R1 to R8 (refer to FIG. 5, and the like) for a plurality of content images from a predetermined region A on the printing plate 26. The region dividing part 60 two-dimensionally divides the predetermined region A mentioned above into a plurality of sub regions. The priority order giving part 62 gives each sub region divided by the region dividing part 60, the order of priority for disposition according to a predetermined rule. The print job determining part 64 determines a plurality of print jobs for ganging from a plurality of print jobs currently registered. The usage amount estimating part 66 estimates respective usage amounts of ink (hereinafter, may referred to as an "ink usage amount") according to each content image. The disposition determining part 68 determines disposed positions of each of content images C1 to C8 considering the order of priority given by the priority order giving part 62.

The display data generation section 56 includes a setting screen 80 (refer to FIG. 4), and a screen generating part 70 that generates a first editing screen 100 (refer to FIG. 5) and a second editing screen 120 (refer to FIG. 6). The display data generation section 56 further includes a map image generating part 72 that generates a map image 128 (refer to FIG. 6) which is a simulated image of the printing plate 26 and which visualizes association between a position of each sub region and the order of priority thereof.

The input unit 48 includes various kinds of input devices such as a mouse, a trackball, a keyboard, and the like. The input unit 48 functions as a ganging information input section 74 that inputs ganging information (information on setting of ganging) and a setting instruction section 76 that instructs setting of ganging.

Figure 3:
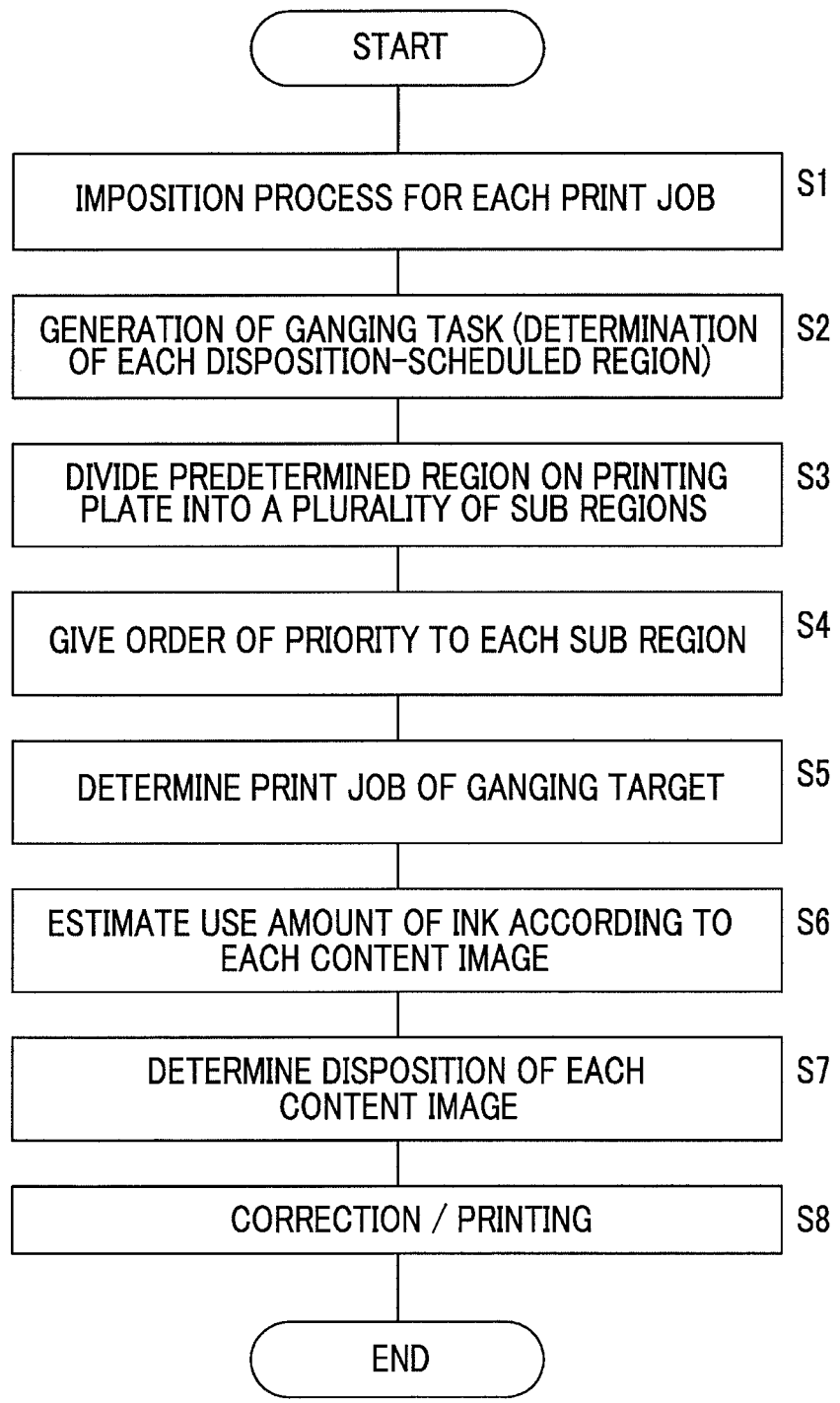
FIG. 3 is a flowchart for describing a work flow of ganging.

The DTP apparatus 18 as an image editing apparatus according to the present embodiment is configured as above. Next, an operation of the DTP apparatus 18 will be described in detail referring to the flowchart of FIG. 3.

In Step S1, the imposition processing section 52 executes an imposition process on content images in a unit of print jobs. Specifically, the imposition processing section 52 executes a preflight process on an input material data (content data), and then performs an imposition process according to instructed binding method and paper-folding method. In addition, in order to cause the server device 16 to store obtained imposition information, the DTP apparatus 18 transmits this imposition information to the outside via the communication I/F 42.

In Step S2, the ganging setting section 54 newly generates a ganging task in response to to a predetermined operation of an operator who is a user. Prior to the generation, the screen generating part 70 generates display data of the setting screen 80, and then supplies the display data to the display control unit 44. Then, the display control unit 44 causes the display unit 46 to display the window W1 (including the setting screen 80).

Figure 4:
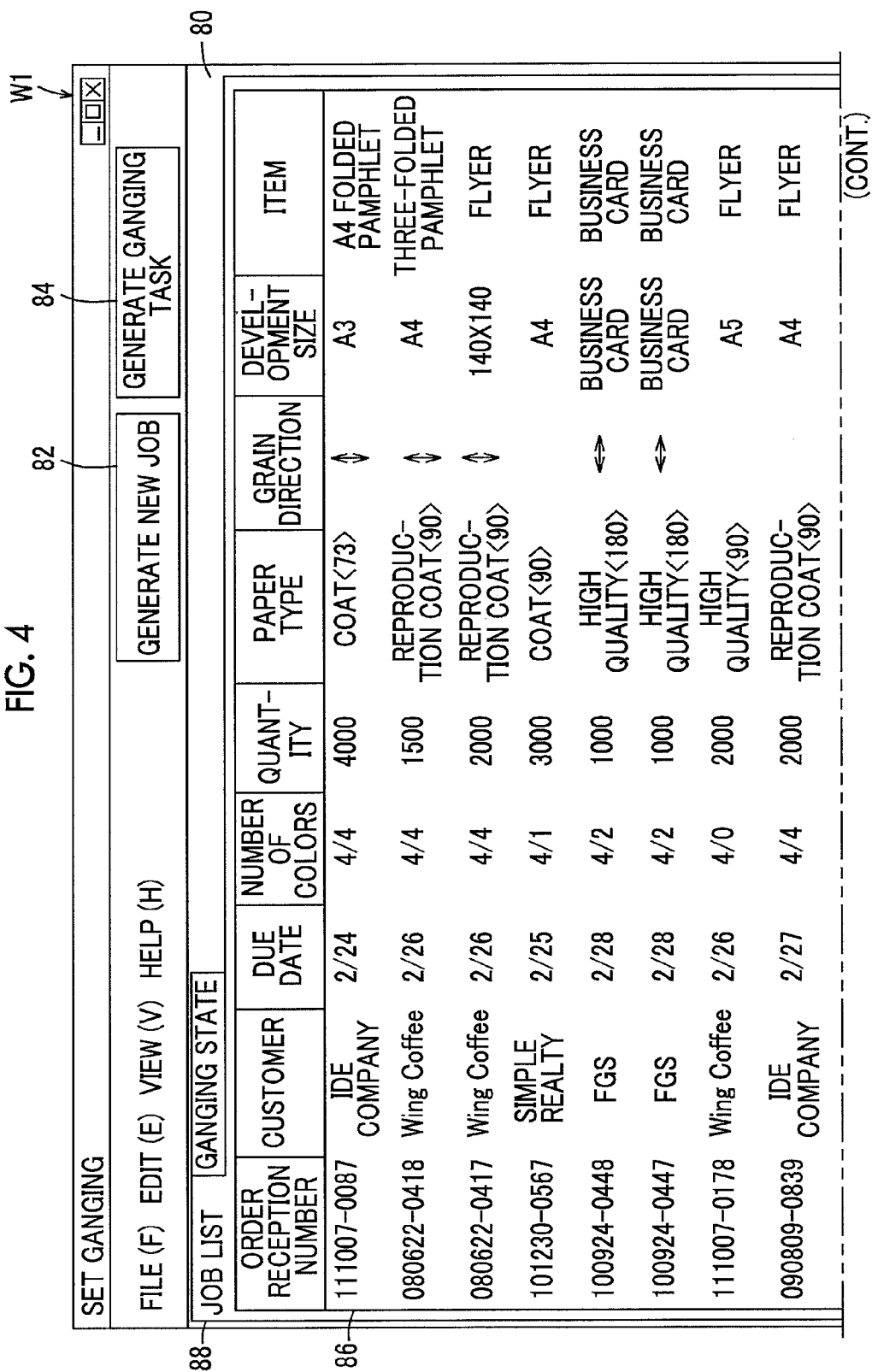
FIG. 4 is an image diagram showing a first state of a setting screen.

As shown in FIG. 4, on the setting screen 80, a button 82 indicated as "generate new job", a button 84 indicated as "generate ganging task", and an information field 86 that shows a list of print jobs currently registered are respectively disposed in order from the upper side of the screen.

In the information field 86, a list of sixteen print jobs is displayed. In addition, eight kinds of conditional details (attributes) are respectively described for each print job. Specifically, in the information field 86, a small field 86*a* that shows received order numbers, a small field 86*b* that shows the names of customers, a small field 86*c* that shows deadlines (for example, delivery dates), a small field 86*d* that shows the number of color plates, a small field 86*e* that shows the quantities (for example, the number of productions), a small field 86*f* that shows the types of the sheet 36, a small field 86*g* that shows the grain directions, a small field 86*h* that shows the developing sizes, and a small field 86*i* that shows items are respectively provided.

[Generation of Ganging Task]

The screen generating part 70 generates display data of the first editing screen 100 in response to clicking operations for the button 84, and then supplies the display data to the display control unit 44. Then, the display control unit 44 causes the display unit 46 to display the window W2 (including the first editing screen 100).

Figure 5:
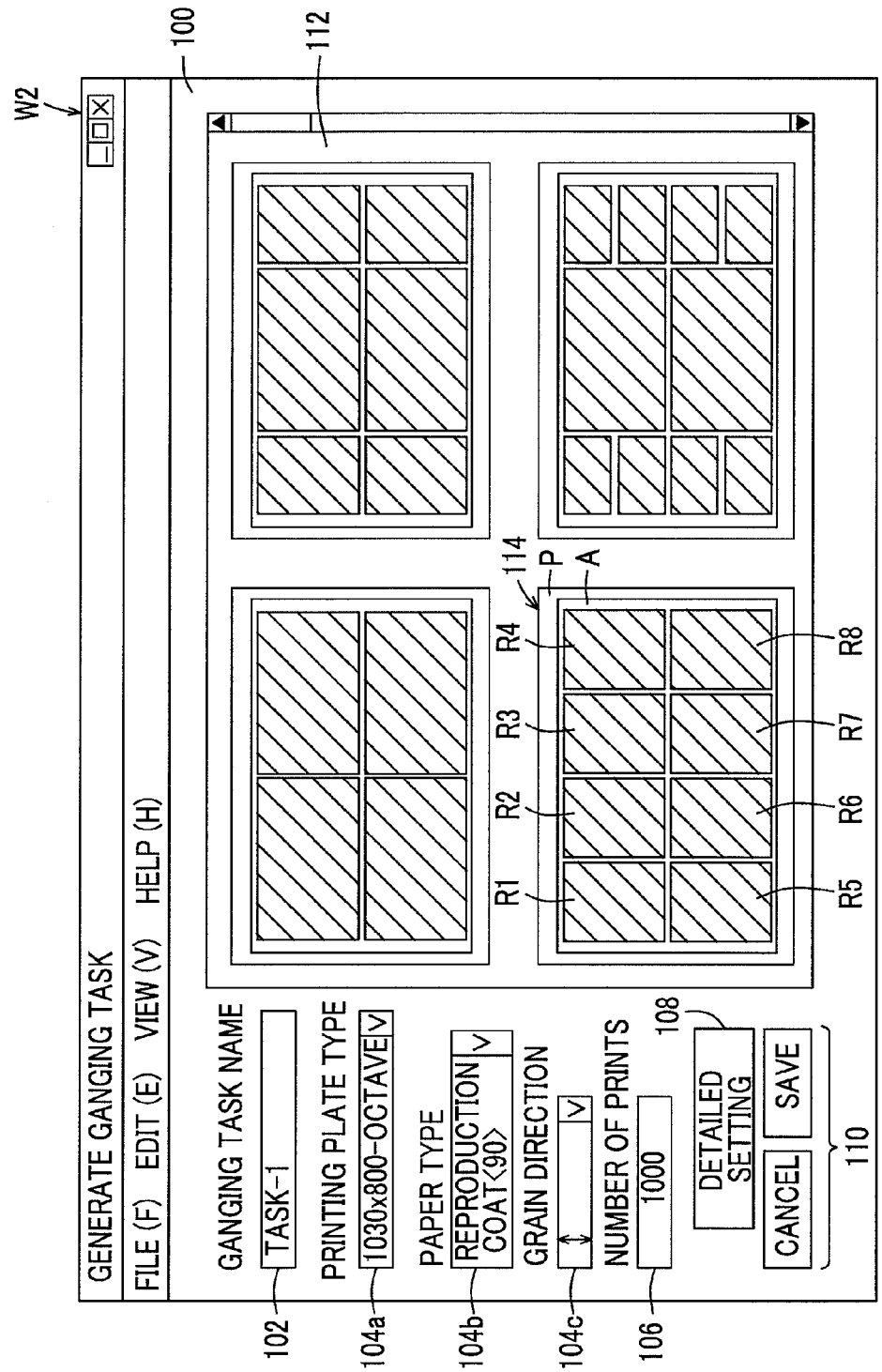
FIG. 5 is an image diagram showing an example of a first editing screen.

As shown in FIG. 5, on the first editing screen 100, one text box 102, three pull-down menus 104*a*, 104*b*, and 104*c*, one text box 106, a button 108 indicated as "set details", a button group 110, and a template field 112 are respectively disposed in order form the left side of the screen. The text box 102, each of the pull-down menus 104*a* to 104*c*, the text box 106, and the template field 112 function as a ganging information input section 74. In addition, the button group 110 (to be specific, a "store" button) functions as the setting instruction section 76.

The template field 112 displays a plurality (four kinds in the example of the drawing) of template screens side by side. A template image 114 is an image obtained by visualizing a printing plate region P on the printing plate 26, a printable region A (predetermined region) in the printing plate region P, and disposition-scheduled regions R1 to R8 of content images, respectively. Herein, each of the disposition-scheduled regions R1 to R8 is disposed as they are not overlapping with each other. The template for ganging may be prepared in advance and provided so as to be selectable, or otherwise the templates may be provided so as to be editable according to preference of the operator.

The operator sets various conditions on a ganging task that is desired to be newly generated on the first editing screen 100. According to an input operation by the operator, for example, "TASK-1" for a registration name of a ganging task (in the text box 102), "1030×800- an octavo full size" for a type of the printing plate (in the pull-down menu 104*a*), "recycled coat <90> (basis weight: 90 g/m$^2$)" for a type of paper (in the pull-down menu 104*b*), "longitudinal direction" for a grain direction (in the pull-down menu 104*c*), "1000 sheets" as the number of printed sheets (in the text box 106), and equal division into 2×4 for the whole disposition (in the template field 112) are respectively set.

In response to a clicking operation of the button group 110 ("store" button), the ganging setting section 54 newly generates a ganging task according to the above-described basic setting. Accordingly, the disposition region determining part 58 determines a plurality of disposition-scheduled regions (herein, the eight disposition-scheduled regions R1 to R8) in the printable region A on the printing plate 26.

In Step S3, the region dividing part 60 two-dimensionally divides a predetermined region (herein, the printable region A) on the printing plate 26 into a plurality of sub regions. For example, the region dividing part 60 segments the long-side direction of the printable region A into six, and segments the short-side direction of the printable region A into four, thereby dividing the region into 24 rectangular sub regions in total. It should be noted that each sub region partitioned as mentioned above is not a region in which a layout of the content images C1 to C8 to be described later is specified. In other words, the number and the shape of sub regions may be arbitrarily set, independently of the form of the ganging template. For example, the regions may be handled as a substantial continuous system by reducing the sizes of the sub regions.

In Step S4, the priority order giving part 62 gives the 24 sub regions divided in Step S3 order of priority in disposition respectively. In response to a clicking operation of the "set details" button 108 on the first editing screen 100 (refer to FIG. 5), the display control unit 44 causes the display unit 46 to display the new window W3 shown in FIG. 6, separate from the window W2. Prior to the display, the map image generating part 72 generates a map image 128 (refer to FIG. 6), which is a simulated image the printing plate 26. The screen generating part 70 generates display data of the second editing screen 120, and then supplies the display data to the display control unit 44. Then, the display control unit 44 causes the display unit 46 to display the window W3 (including the second editing screen 120).

On the second editing screen 120 of FIG. 6, four setting fields 121, 122, 123, and 124, and a button group 126 are respectively disposed in order from the left side of the screen. Herein, each of the setting fields 121 to 124 functions as the ganging information input section 74. In addition, the button group 126 (to be specific, a "store" button) functions as the setting instruction section 76.

In the setting field 121, a map image 128 that is an image, which is a simulated image of the printing plate 26 and which visualizes association between positions of each sub region and order of priority, and one text box 130 are disposed.

Twenty-four rectangular cells on the map image 128 respectively indicate twenty-four sub regions. Numbers in each of the rectangular cells indicate the order of priority in disposition of content images. To be specific, priorities become higher as the values become lower, and priorities become lower as the numbers become greater. In the example of the drawing, ascending priorities are given to transfer amounts of ink onto the sheet 36 (hereinafter, which may be referred to as an "ink usage amount") in order of relatively greater amounts. Hereinafter, an ink transfer amount in each portion when a solid image or a tint (halftone solid) image is printed is referred to as a "relative transfer amount." The example of the map image 128 shown in the drawing shows that the relative transfer amount increases toward the lower portion of the center of the printing plate 26, and the relative transfer amount decreases toward the horizontal direction of the printing plate 26. Particularly, in a case of the off-set printer 32, an inclination (irregularity) of a transfer amount of ink is likely to appear apparently in a feeding direction of the sheet 36.

The text box 130 with spinboxes is provided so as to input and set a threshold value (lower limit value) of a picture area ratio. Herein, the "picture area ratio" means a ratio of an actual usage amount to a maximum ink usage amount in an image region in which each content image is shown. A so-called high key image corresponds to a content image with a picture area ratio close to 0%, and a so-called low key image corresponds to a content image with a picture area ratio close to 100%.

In the setting field 122, three radio buttons with which sorting methods of content images can be input and set are disposed. The operator can select one option of sorting the images in a trim position, sorting them in a bleed position, or sorting them in the size of the sheet 36 for the printable region A through the setting field 122.

In the setting field 123, four (two pairs of) radio buttons with which sorting methods of content images can be input and set are disposed. The operator can select one option of sorting the images on a gripper edge side (lower side) of the longitudinal direction of the printing plate 26, or sorting them on the opposite side (upper side) thereto through the setting field 123. In addition, the operator can select one option of sorting the images on side-guide edge side (left side) of the horizontal direction of the printing plate 26, or sorting them on the opposite side (right side) thereto through the setting field 123. Herein, the "gripper edge" refers to a side in which the sheet 36 (sheet) is gripped using gripping claws (grippers) of the off-set printer 32 which is not shown. In addition, the "side-guide edge" refers to a side in which the position of the sheet 36 is aligned in the width direction.

In the setting field 124, three check boxes 132a, 132b, and 132c are disposed. The operator can independently select whether or not to allow rotation of a content image (in the check box 132a), whether or not to dispose the images aligning in the grain direction (in the check box 132b), or whether or not to dispose the images considering the picture area ratio (in the check box 132c) through the setting field 124.

The operator sets respective detailed conditions with regard to a ganging task through the second editing screen 120. In response to an input operation performed by the operator, it is assumed that the order of priority in disposition, being equal to or higher than the picture area ratio of 50% (in the setting field 121), "sort in a trim position" (in the setting field 122), "sort on the upper side and the right side" (in the setting field 123), "allow rotation of an image", and "consider the picture area ratio" (in the setting field 124) are respectively set.

In response to a clicking operation of the button group 126 (the "store" button), the ganging setting section 54 updates setting content for ganging according to the above-described detailed settings. Accordingly, the priority order giving part 62 give the order of priority in disposition of the content images in advance.

There may be cases in which two-dimensional distribution of a relative transfer amount of ink shows different tendencies due to a unique characteristic of the off-set printer 32. Thus, the priority order giving part 62 may appropriately change the sequence of order of priority according to various output characteristics of the off-set printer 32 (for example, a combination of the off-set printer 32, the printing plate 26, and the sheet 36). Alternatively, the numbers in each of the rectangular cells on the map image 128 may be provided so as to be changed according to a predetermined operation by the operator (for example, drag-and-drop, text input, or the like). Furthermore, a colorimetric value in each portion of a tint image, or the like formed on the printed matter 30 can be input, and the priority order giving part 62 may automatically give order by computing the order of priority in disposition based on each input colorimetric value.

In Step S5, the print job determining part 64 determines a plurality of print jobs which are target for ganging. To be specific, the print job determining part 64 extracts 8 or more print jobs that satisfy disposition permitting conditions in each of the disposition-scheduled regions R1 to R8 from a number of print jobs which are currently registered in the server device 16 (refer to FIGS. 1 and 2). As a disposition permitting condition, for example, meeting all specific condition items (the type of paper, the grain direction, and the developing size) may be imposed. The disposition permitting condition is not limited thereto, and may of course be appropriately changed.

In Step S6, the usage amount estimating part 66 estimates respective ink usage amounts according to each of the content images. For the estimation method of an ink usage amount, various known arithmetic operation methods can be employed. For example, it is assumed that the number of color plates of the content images is four (a C plate, an M plate, a Y plate, and a K plate), and picture area ratios are respectively 20% for the C plate, 30% for the M plate, 50% for the Y plate, and 20% for the K plate. In this case, the usage amount estimating part 66 may estimate 50% for the Y plate which is the maximum picture area ratio among the color plates as the ink usage amount of the content images. In this case, the obtained estimation value approximately corresponds to a ratio of an area in which ink is coated to the entire image face. In the case where the value (for example, mesh %) of each pixel of a content image is associated with an ink usage amount, the ink usage amount can be estimated without converting the content image into a halftone image.

As shown in FIG. 7, it is assumed that the ink usage amounts are 80%, 75%, 70%, 60%, 55%, 45%, 30%, and 20% in a descending order. Eight content images which are targets for ganging from the left side to the right side of the drawing are referred to as C1 to C8 respectively hereinbelow.

In the present embodiment, the usage amount estimating part 66 estimates each of the ink usage amounts for all print jobs (content images) determined in Step S5. Meanwhile, the usage amount estimating part 66 may estimate respective ink usage amounts for two or more print jobs (content images) to which a disposition rule to be described later is applied.

In Step S7, the disposition determining part 68 executes a ganging task, and determines each of disposing positions of the content images C1 to C8. The method for determining the disposition by the disposition determining part 68 will be described referring to FIGS. 8A to 11.

First, the disposition determining part 68 determines respective positions of the disposition-scheduled regions R1 to R8 based on "1030×800- an octavo full size" for a type of the printing plate, equal division into 2×4 for the whole disposition, and sorting setting ("trim", "opposite side (upper)", and "opposite side (right)"). In this case, the disposition determining part 68 determines respective disposing positions of the disposition-scheduled regions R1 to R8 (in other words, the content images C1 to C8) so as to align with the end of the printable region A on the printing plate 26 on the opposite side of the gripper edge and the side-guide edge.

Then, the disposition determining part 68 sequentially assigns the content images C1 to C8 to the disposition-scheduled regions R1 to R8 according to a predetermined disposition rule referring to the order of priority given in Step S4. However, the positions and the size of the disposition-scheduled regions R1 to R8 (refer to FIG. 5) determined in Step S2 do not respectively coincide with the positions and the sizes of the 24 sub regions (refer to the map image 128 of FIG. 6) divided in Step S3. Thus, the disposition determining part 68 computes respective priorities of the disposition-scheduled regions R1 to R8 using the order of priority.

Figure 8A:
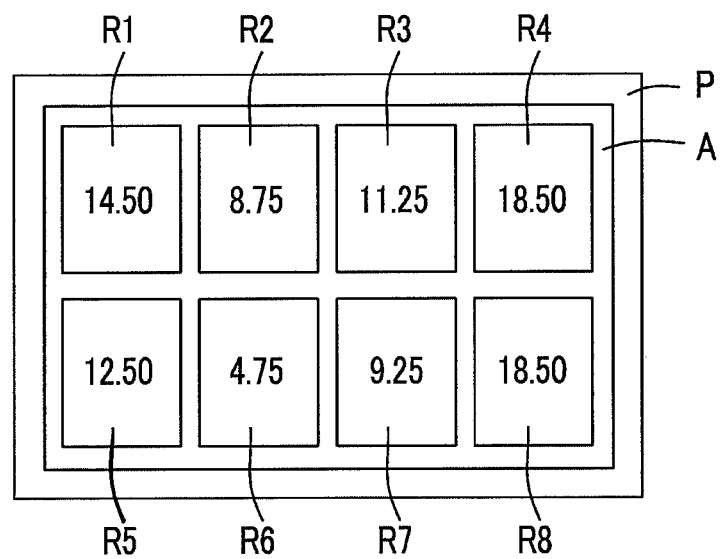
FIG. 8A is an outlined descriptive diagram showing the order of priority in disposition in each disposition-scheduled region.

As shown in FIG. 8A, the disposition determining part 68 gives the degree of priority "14.50" that is the average value of the priority orders "20," "10," "19," and "9" to the disposition-scheduled region R1 that spans the sub regions having the priority orders. The disposition determining part 68 gives the degree of priority "8.75" that is the average value of the priority orders "10," "11," "9, " and "5" to the disposition-scheduled region R2 that spans the sub regions having the priority orders. The disposition determining part 68 gives the degree of priority "11.25" that is the average value of the priority orders "12," "13," "6, " and "14" to the disposition-scheduled region R3 that spans the sub regions having the priority orders. The disposition determining part 68 gives the degree of priority "18.50" that is the average value of the priority orders "13," "24," "14, " and "23" to the disposition-scheduled region R4 that spans the sub regions having the priority orders.

The disposition determining part 68 gives the degree of priority "12.50" that is the average value of the priority orders "18," "8," "17, " and "7" to the disposition-scheduled region R5 that spans the sub regions having the priority orders. The disposition determining part 68 gives the degree of priority "4.75" that is the average value of the priority orders "8," "3," "7, " and "1" to the disposition-scheduled region R6 that spans the sub regions having the priority orders. The disposition determining part 68 gives the degree of priority "9.25" that is the average value of the priority orders "4," "15," "2, " and "16" to the disposition-scheduled region R7 that spans the sub regions having the priority orders. The disposition determining part 68 gives the degree of priority "18.50" that is the average value of the priority orders "15," "22," "16, " and "21" to the disposition-scheduled region R8 that spans the sub regions having the priority orders.

Figure 8B:
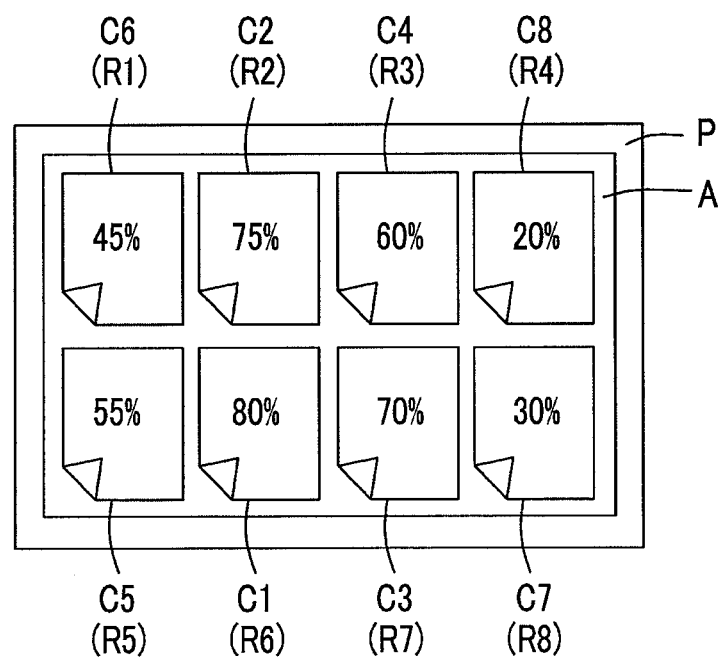
FIG. 8B is a schematic diagram showing disposition results of each content image shown in FIG. 7.

Then, the disposition determining part 68 determines the disposing positions of the content images C1 to C8 by sequentially disposing the content images C1 to C8 which are estimated to have large ink usage amounts in the disposition-scheduled regions R6, R2, and the like having the high degree of priority in disposition (in other words, having large ink transfer amounts). As a result, as shown in FIG. 8B, (C1, R6), (C2, R2), (C3, R7), (C4, R3), (C5, R5), (C6, R1), (C7, R8), and (C8, R4) are disposed in order on the printable region A. Herein, the expression of (C1, R6) means that the content image C1 is disposed in the disposition-scheduled region R6.

In addition, the disposition determining part 68 may partially adopt the disposition rule of the images according to the above-described order of priority. For example, the above-described disposition rule can be selectively applied by inputting "50" to the text box 130 on the second editing screen 120 (refer to FIG. 6) and checking the check box 132c. To be specific, this disposition rule is applied only to the content images C1 to C5 that have an ink usage amount of 50% or more (within a predetermined range), and not applied to the content images C6 to C8 that have an ink usage amount of less than 50% (out of the predetermined range). Accordingly, the remaining content images C6 to C8 to which the disposition rule is not applied can be freely disposed in the remaining disposition-scheduled regions R1, R4, and R8, and the degree of freedom for setting ganging thereby increases, which is convenient for the operator.

Furthermore, the disposition determining part 68 may determine not only the respective disposing positions of the content images C1 to C8 but also the orientations thereof. For example, disposition of the rotated content images C1 to C8 is allowed by checking the check box 132a on the second editing screen 120 (refer to FIG. 6). In this case, the distribution characteristic of the ink usage amount of the content image C1, or the like is considered.

Figure 9A:
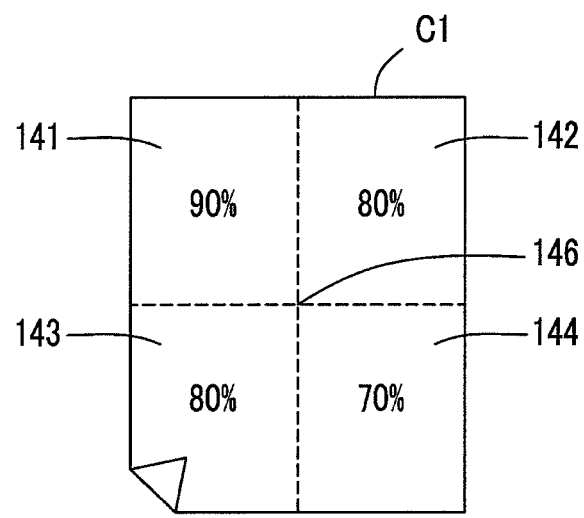
FIGS. 9A and 9B are schematic diagrams showing distribution characteristics of usage amounts of ink within a content image.

FIG. 9A is a schematic diagram showing a distribution characteristic of the ink usage amounts of the (upright) content image C1. In the example of the drawing, a single image region is divided into four portions of a first portion 141 (upper-left portion), a second portion 142 (upper-right portion), a third portion 143 (lower-left portion), and a fourth portion 144 (lower-right portion). The usage amount estimating part 66 is assumed to estimate respective ink usage amounts of the first to fourth portions 141 to 144 to be 90%, 80%, 80%, and 70%. In this case, the ink usage amount of the upper-left portion (first portion 141) of the content image C1 is set to be the largest.

Figure 9B:
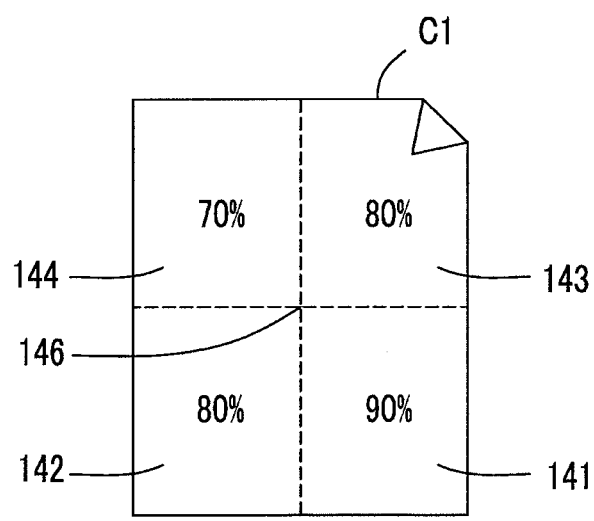

FIG. 9B is a schematic diagram showing a distribution characteristic of the ink usage amounts of the (upside-down) content image C1. The drawing corresponds to the content image C1 obtained by pivoting the content image C1 shown in FIG. 9A by 180 degrees in the right direction from a position 146. In this case, the ink usage amount of the lower-right portion (first portion 141) of the content image C1 is set to be the largest.

Figure 10A:
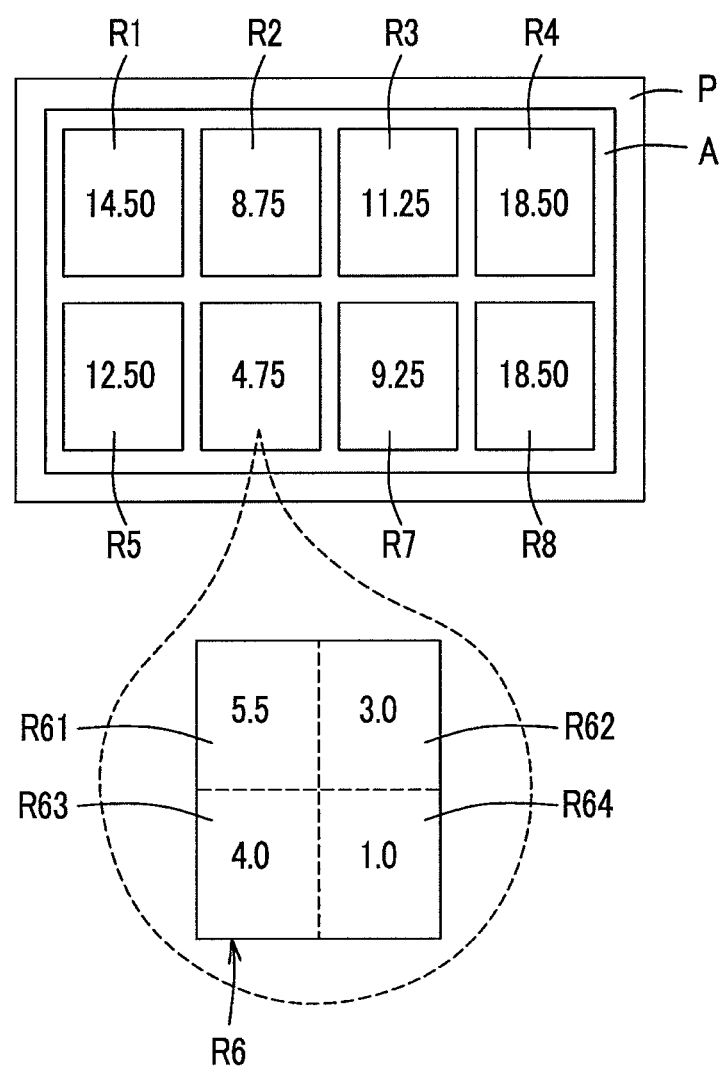
FIG. 10A is an outlined descriptive diagram showing the order of priority in disposition in each small region within a disposition-scheduled region.
Figure 10B:
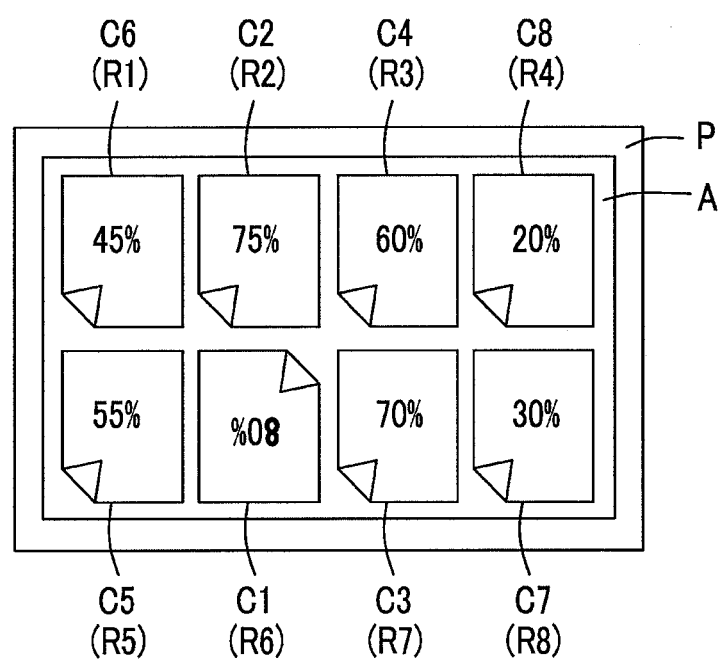
FIG. 10B is a schematic diagram showing other disposition result of each content image shown in FIG. 7.

As shown in FIG. 10A, the disposition determining part 68 divides one disposition-scheduled region R6 into four small regions R61, R62, R63, and R64, and further determines the order of priority (degree of priority) for them. The disposition determining part 68 is assumed to compute the degree of priority of the small regions R61 to R64 as "5.5," "3.0," "4.0, " and "1.0" respectively referring to each value in the map image 128. In this case, in the same manner as in the cases of FIGS. 9A and 9B, the first portion 141 that has a relatively large ink usage amount is disposed in the small region R64 (the degree of priority of "1.0"), and the fourth portion 144 that has a relatively small ink usage amount is disposed in the small region R61 (the degree of priority of "5.5"). In other words, the disposition determining part 68 determines such that the content image C1 is disposed according to the direction of the image (upside-down) shown in FIG. 9B.

Figure 11:
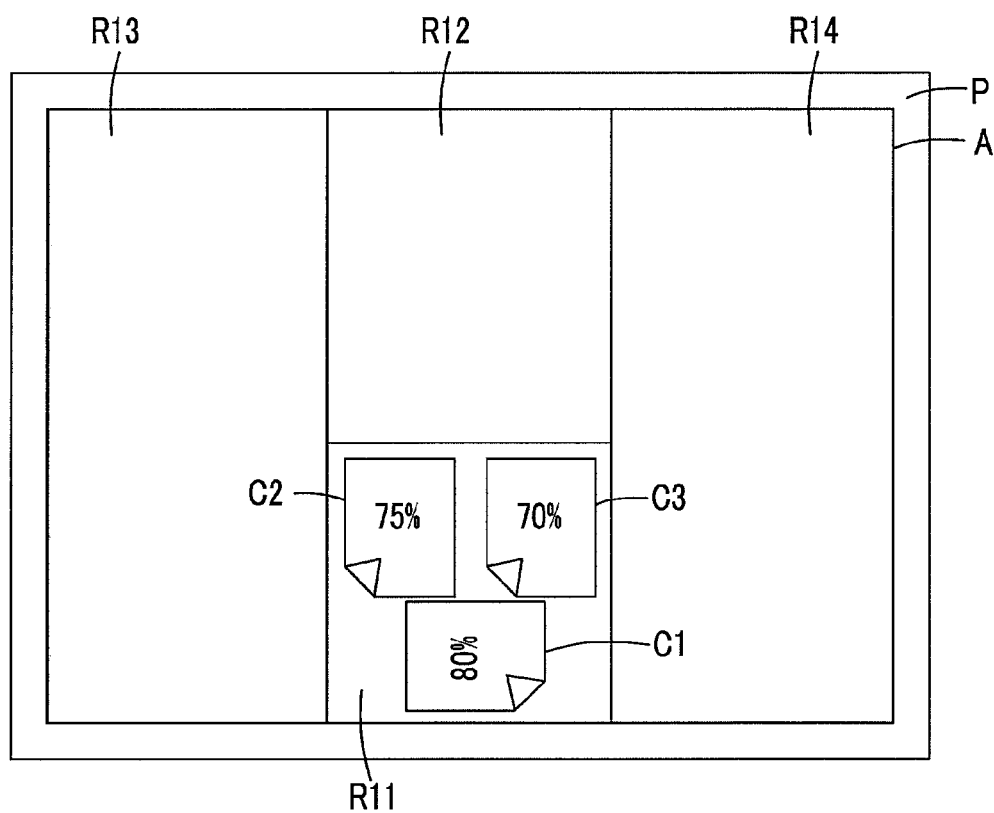
FIG. 11 is a schematic diagram showing still other disposition results of content images.

Furthermore, as shown in FIG. 11, the degree of freedom in the disposition of the content images C1 to C3 may be raised. To be specific, the disposition region determining part 58 determines four disposition-possible regions R11, R12, R13, and R14 in the printable region A. Then, the disposition determining part 68 may determine the positions and the orientations of the content images C1 to C3 to be disposed so that the images do not overlap with other disposition-possible regions R12 to R14 in the disposition-possible region R11. Accordingly, the disposition of the content images C1 to C3 can be further optimized. In addition, the disposition of the rotated content mages C1 to C3 that does not align with the grain direction may be prohibited by inputting a checking mark in the check box 132b on the second editing screen 120 (refer to FIG. 6).

Furthermore, as ganging information, accessories such as a register mark, a color mark, or a control strip, and at least one dividing line that divides the adjacent content images C1 to C8 may be respectively disposed, in addition to the content images C1 to C8. In addition, these dividing lines may also serve as a mark that specifies a cut position (cutting line) of the printed matter 30. Furthermore, when there are a plurality of cutting lines, character information indicating order of cutting may be disposed near each of the cutting lines (particularly, a starting position).

In this manner, when setting for ganging is confirmed, the ganging setting section 54 finishes the ganging task. Then, since obtained ganging information is stored in the server device 16, the DTP apparatus 18 transmits the ganging information to the outside (on the LAN 34 side) via the communication I/F 42.

In Step S8, correction and printing processes are executed. The RIP device 20 performs ganging based on the ganging information confirmed in Step S7, performs rasterizing on obtained correction data (or proofread data), and then supplies print data that has been processed to the proof press 24 (or the plate setter 28). Accordingly, the proof press 24 (or the off-set printer 32) can form the proof 22 (or the printed matter 30). As a result, low-key content images and high-key content images are respectively formed in a portion that has a relatively large ink transfer amount and a portion that has a relatively small ink transfer amount.

As above, since the priority order giving part 62 that gives the order of priority in disposition to the plurality of sub regions which are two-dimensionally divided in order of relatively large ink transfer amounts onto the sheet 36, and the disposition determining part 68 that determines the respective disposing positions of the content images C1 to C8 according to the disposition rule for sequentially disposing content images (for example, C1) that is estimated to have a large ink usage amount by the usage amount estimating part 66 in a sub region to which a high priority is given by the priority order giving part 62 are provided, a content image that has a large ink usage amount can be disposed in a sub region having a high priority, and a content image that has a small ink usage amount can be disposed in a sub region having a low priority.

In general, higher color reproducibility is likely to be found in regions that have relatively higher ink transfer amounts. By sequentially disposing content images (images having a large ink usage amount) that require high color reproducibility in the regions, the entire colors on the printed matter 30 formed on the sheet 36 can be stably reproduced. In other words, even when there is two-dimensional unevenness in ink transfer amounts, the colors of the printed matter 30 can be stably reproduced using a simple technique that does not require complicated adjustment of the off-set printer 32 (considering the disposition of the content images C1 to C8).

Particularly, in the case of the off-set printer 32, since an inclination (unevenness) of ink transfer amounts apparently appears in the feed direction of the sheet 36, the present method is even more effective.

The present invention is not limited to the above-described embodiment, and modifications may be made without departing from the spirit and scope of the present invention as set forth in the appended claims.

What is claimed is:

1. An image editing apparatus configured to perform ganging of a plurality of content images on a printing plate capable of transferring ink onto an output medium, comprising:
a region dividing unit that two-dimensionally divides a predetermined region on the printing plate into a plurality of sub regions;
a priority order giving unit that gives an order of priority of disposition to each of the sub regions divided by the region dividing unit in a descending order of relative transfer amounts of the ink onto the output medium;
a usage amount estimating unit that estimates respective usage amounts of the ink according to two or more content images out of the plurality of content images; and
a disposition determining unit that determines respective disposing positions of the content images according to a disposition rule for sequentially disposing the content images of which the usage amount is estimated to be large by the usage amount estimating unit in the sub regions having high priorities given by the priority order giving unit.

2. The image editing apparatus according to claim 1, wherein the usage amount estimating unit further estimates a distribution characteristic of the usage amount of each of the content images, and
wherein the disposition determining unit further determines an orientation of each of the content images based on the distribution characteristic estimated by the usage amount estimating unit so that portions of the content images of which the usage amount is estimated to be large are disposed in the sub regions having high priorities.

3. The image editing apparatus according to claim 1, further comprising:
a map image generating unit that generates a map image, which is a simulated image of the printing plate and which visualizes association between a position of each of the sub regions and the order of priority.

4. The image editing apparatus according to claim 2, further comprising:
a map image generating unit that generates a map image, which is a simulated image of the printing plate and which visualizes association between a position of each of the sub regions and the order of priority.

5. The image editing apparatus according to claim 1, wherein the priority order giving unit gives each of the sub regions the order of priority according to a characteristic of a printer.

6. The image editing apparatus according to claim 2, wherein the priority order giving unit gives each of the sub regions the order of priority according to a characteristic of a printer.

7. The image editing apparatus according to claim 3, wherein the priority order giving unit gives each of the sub regions the order of priority according to a characteristic of a printer.

8. The image editing apparatus according to claim 1, wherein the disposition determining unit determines respective disposing positions of the content images of which the usage amount belongs to a predetermined range out of the plurality of content images according to the disposition rule.

9. The image editing apparatus according to claim 2, wherein the disposition determining unit determines respective disposing positions of the content images of which the usage amount belongs to a predetermined range out of the plurality of content images according to the disposition rule.

10. The image editing apparatus according to claim 3, wherein the disposition determining unit determines respective disposing positions of the content images of which the usage amount belongs to a predetermined range out of the plurality of content images according to the disposition rule.

11. The image editing apparatus according to claim 1, wherein the disposition determining unit determines the respective disposing positions of the content images so as to align the content images with an end of a printable region on the printing plate on an opposite side of a gripper edge and/or a side-guide edge.

12. The image editing apparatus according to claim 2, wherein the disposition determining unit determines the respective disposing positions of the content images so as to align the content images with an end of a printable region on the printing plate on an opposite side of a gripper edge and/or a side-guide edge.

13. The image editing apparatus according to claim 3, wherein the disposition determining unit determines the respective disposing positions of the content images so as to align the content images with an end of a printable region on the printing plate on an opposite side of a gripper edge and/or a side-guide edge.

14. The image editing apparatus according claim 1, wherein the disposition determining unit further determines a disposing position of at least one dividing line, which divides adjacent content images.

15. The image editing apparatus according claim 2, wherein the disposition determining unit further determines a disposing position of at least one dividing line, which divides adjacent content images.

16. The image editing apparatus according claim 3, wherein the disposition determining unit further determines a disposing position of at least one dividing line, which divides adjacent content images.

17. An image editing method for ganging a plurality of content images on a printing plate capable of transferring ink onto an output medium using an image editing apparatus according to claim 1, comprising:
- two-dimensionally dividing a predetermined region on the printing plate into a plurality of sub regions;
- giving an order of priority of disposition to each of the divided sub regions in a descending order of relative transfer amounts of the ink onto the output medium;
- estimating respective usage amounts of the ink according to two or more content images out of the plurality of content images; and
- determining respective disposing positions of the content images according to a disposition rule for sequentially disposing the content images of which the usage amount is estimated to be large in the sub regions having given high priorities.

18. A non-transitory computer-readable recording medium having recorded thereon a program for ganging a plurality of content images on a printing plate capable of transferring ink onto an output medium, the program causing an image editing apparatus according to claim 1 to function as:
- a region dividing unit that two-dimensionally divides a predetermined region on the printing plate into a plurality of sub regions;
- a priority order giving unit that gives an order of priority of disposition to each of the sub regions divided by the region dividing unit in a descending order of relative transfer amounts of the ink onto the output medium;
- a usage amount estimating unit that estimates respective usage amounts of the ink according to two or more content images out of the plurality of content images; and
- a disposition determining unit that determines respective disposing positions of the content images according to a disposition rule for sequentially disposing the content images of which the usage amount is estimated to be large by the usage amount estimating unit in the sub regions having high priorities given by the priority order giving unit.

* * * * *